(12) United States Patent
Ross

(10) Patent No.: US 6,240,001 B1
(45) Date of Patent: May 29, 2001

(54) CAM MATCH LINE PRECHARGE

(75) Inventor: Mark Ross, San Carlos, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/496,994

(22) Filed: Feb. 14, 2000

Related U.S. Application Data

(63) Continuation of application No. 09/130,747, filed on Aug. 7, 1998, now Pat. No. 6,101,115.

(51) Int. Cl.[7] .................................................. G11C 15/00
(52) U.S. Cl. ............................................. 365/49; 365/203
(58) Field of Search .............................. 365/48, 203, 168

(56) References Cited

U.S. PATENT DOCUMENTS

| | | | |
|---|---|---|---|
| 5,598,115 | * 1/1997 | Holst | 365/49 |
| 5,617,348 | * 4/1997 | Maguire | 365/49 |
| 5,621,677 | * 4/1997 | Jones | 365/49 |
| 6,044,005 | * 3/2000 | Gibson et al. | 365/49 |
| 6,081,441 | * 6/2000 | Ikeda | 365/49 |
| 6,101,115 | * 8/2000 | Ross | 365/49 |

* cited by examiner

*Primary Examiner*—Trong Phan
(74) *Attorney, Agent, or Firm*—Skjerven Morrill MacPherson LLP; Paul E. Lewkowicz

(57) ABSTRACT

A method and system for improved CAM match line precharge in which the amount of power consumed by match line precharge and discharge is significantly reduced. An independent match precharge voltage is introduced to the CAM, which is used to separately precharge the match line and is available for use by comparison circuits to attempt to match the input tag. The match precharge voltage is selected so as to reduce the relative power consumption for match line precharge and discharge by a factor of about five. Optionally, sense amplifiers in the comparison circuits are disposed so as to compare each discharged match line with the match precharge voltage itself.

68 Claims, 1 Drawing Sheet

CAM MATCH LINE PRECHARGE

This Appln is a continuation of Ser. No. 09/130,747 filed Aug. 7, 1998, Pat. No. 6,101,115.

BACKGROUND OF THE INVENTION

1. Field of the Invention

This invention relates to CAM match line precharge.

2. Related Art

A CAM (content addressable memory) is sometimes used in a computer system or device for storing and retrieving information. CAMs have the advantage the they can rapidly link associated data with known tags; it is thus possible to perform rapid lookup of the associated data once the tag is known. Known CAMs include comparison circuits for matching an input tag with each tag recorded in the CAM, so as to determine which if any of the row or lines in the CAM matches the tag.

In some known CAMs each row or line includes a set of memory cells, each of which includes a recorded match bit for comparison with the input tag. The comparison circuits operate by precharging a match line and coupling that match line to circuits for all the recorded match bits. If any recorded match bit is not the same as the input tag, the match line is discharged. Thus, most match lines are discharged, even though the CAM does not deliver the data associated with the unmatched tag.

One problem in the known art is that power consumption from precharging and discharging the match line is relatively high. This problem is exacerbated when the CAM is relatively large, that is, when the number of bits to be matched in the tag is relatively large. In addition to the amount of power consumed by precharge and discharge of the match line, the process of precharging and discharging the match line can be time consuming relative to the total time for the CAM to respond to the input tag. It would be advantageous to reduce both the relative amount of power consumption and the relative time required for operation of the CAM.

Accordingly, it would be desirable to provide a method and system for improved CAM match line precharge. This advantage is achieved in an embodiment of the invention in which the amount of power consumed by match line precharge and discharge is significantly reduced by use of a relatively lower discharge voltage. This has two further advantages: (1) discharging from a lower voltage is relatively faster, and (2) use of the lower voltage as an input to the sense amplifier speeds up comparisons.

SUMMARY OF THE INVENTION

The invention provides a method and system for improved CAM match line precharge, in which the amount of power consumed by match line precharge and discharge is significantly reduced. An independent match precharge voltage is introduced to the CAM, which is used to separately precharge the match line and is available for use by comparison circuits to attempt to match the input tag. In a preferred embodiment, the match precharge voltage is selected so as to reduce the relative power consumption for match line precharge and discharge by a factor of about five.

In a preferred embodiment, sense amplifiers in the comparison circuits are disposed so as to compare each discharged match line with the match precharge voltage itself, or to take advantage of the lower signal swing to speed up single-ended sensing schemes.

BRIEF DESCRIPTION OF THE DRAWINGS

The FIGURE shows a block diagram of an improved system for CAM match line precharge.

DETAILED DESCRIPTION OF THE PREFERRED EMBODIMENT

Figure 1:
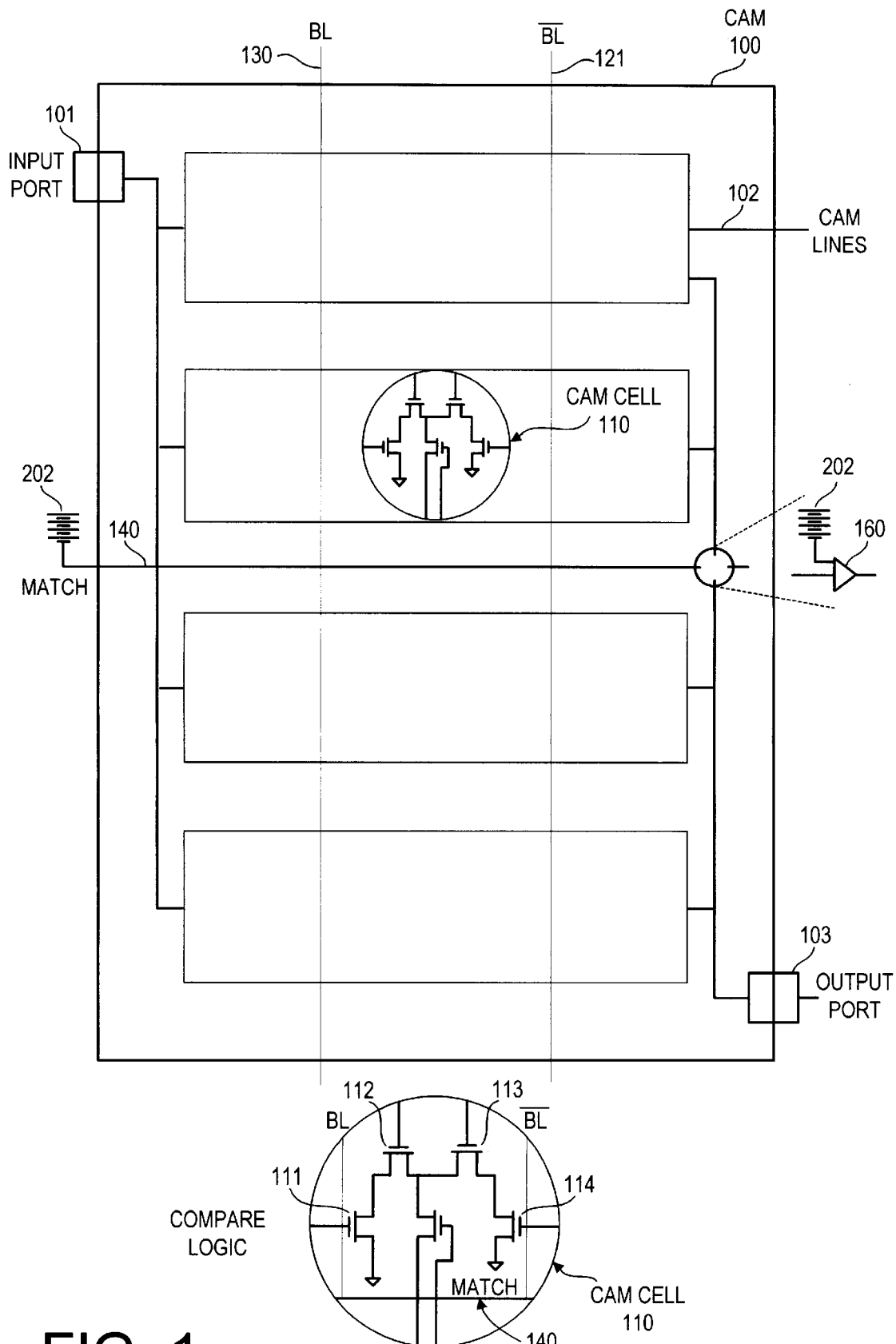

In the following description, a preferred embodiment of the invention is described with regard to preferred process steps and data structures. Those skilled in the art would recognize after perusal of this application that embodiments of the invention can be implemented using circuits adapted to particular process steps and data structures described herein, and that implementation of the process steps and data structures described herein would not require undue experimentation or further invention.

System Elements

The FIGURE shows a block diagram of an improved system for CAM match line precharge.

Operation of CAM

A CAM 100 includes an input port 101, a plurality of CAM lines 102, and an output port 103. Each one CAM line 102 is disposed to match an input value from the input port 101 to a tag value recorded at the CAM line 102, and to output a logical match bit indicating whether the input value is equal to the tag value. An accumulator (not shown) collects the logical match bits and selects at least one stored value associated with the one tag value that matches the input value. In an ordinary binary CAM, there will be one such matched stored value, while in a ternary CAM, there can be multiple such matched stored values.

Each CAM line 102 includes a plurality of CAM cells 110, one for each bit of the tag value. Each CAM cell is coupled to a bit line 130 BL (and an inverted bit line 121 BL-bar), and to a match line 140 MATCH. In alternative embodiments, the CAM cells 110 may be coupled to independent compare lines.

Each CAM cell 110 includes a set of four transistors Q1, Q2, Q3, and Q4 respectively shown in the FIGURE as 111, 112, 113, and 114, that collectively form, for all CAM cells 110 in a CAM line 102, a wired-XNOR circuit. The wired-XNOR circuit thus has a plurality of inputs (one for each CAM cell 110), and a single output (not shown). Each input is responsive to whether the single CAM cell 110 matches the input value for the CAM 110 to the tag value for that CAM line 102.

Although a preferred embodiment uses a four-transistor wired-XNOR circuit, those skilled in the art will recognize, after perusal of this application, that many other alternatives are possible that can achieve the same or a similar result, and that such alternatives would not require further invention or undue experimentation. Such alternatives are within the scope and spirit of the invention.

In a preferred embodiment, the wired-XNOR circuit is coupled to the match line 140 MATCH. The match line 140 MATCH is precharged with a match line voltage, and the bit line 130 BL (and the inverted bit line 121 BL-bar) are enabled for those bits of the input value that are logical "1." The wired-XNOR circuit 150 discharges the match line 140 MATCH at each CAM cell 110 for those bits of the input value that do not match the corresponding bit of the tag value at that CAM cell 110. If any bit of the wired-XNOR circuit discharges the match line 140 MATCH, the match line 140 MATCH discharges and presents a logical "0" for the output of the wired-XNOR circuit.

Thus, the amount of power consumed by precharging and discharging the match lines 140 MATCH is given by equation 201:

$$P = nCv^2 f \tag{201}$$

where

P=power consumed,
n=number of match lines,
C=capacitance of each match line,
v=voltage swing for each match line, and
f=frequency of CAM operations.

A sense amplifier 160 is coupled to each match line 140 MATCH, and is disposed for comparing a voltage for the match line 140 MATCH with a threshold voltage. An input value that is nearly equal to the tag value for a particular CAM line 102 will cause the match line 140 MATCH to discharge nearly, but not entirely. The sense amplifier 160 is sensitive to slight changes in the voltage on the match line 140 MATCH.

Match Precharge Voltage

An independent match line precharge voltage (IMPV) 202 is coupled to each match line 140 MATCH to precharge the match line 140 MATCH. In a preferred embodiment, the IMPV 202 is supplied to the CAM 100 from an external source.

As shown above in equation 201, the power consumption of the CAM 100 proportional to $(IMPV)^2$. In a first preferred embodiment, the expected operating voltage of the CAM 100 is about 2.5 volts, and the IMPV 202 is selected to be substantially less, such as about 1.8 volts. In a second preferred embodiment, the expected operating voltage of the CAM 100 is about 1.8 volts, and the IMPV 202 is selected to be substantially less, such as about 1.0 volts. In either case, power consumption is substantially less than if the operating voltage of the CAM 100 were used instead of the IMPV 202.

Those skilled in the art will recognize, after perusal of this application, that power consumption using the IMPV 202 is about 20% to about 50% of when using the operating voltage as the match precharge voltage.

The IMPV 202 may be coupled to each sense amplifier 160 for use as the selected threshold voltage. This promotes recognition of relatively small voltage changes in each match line 140 MATCH. In a preferred embodiment, the TMPV 202 is selected so as to provide a sufficient noise margin at the sense amplifier 160, so that the noise margin is above the switching point of a single-ended sense amplifier 160.

Application to CAM Design

Those skilled in the art will recognize, after perusal of this application, that the invention is well suited for use in different types of CAM, including both binary CAMs and ternary CAMs.

In a ternary CAM, each CAM cell 110 includes both a tag value and a mask value. The mask value determine whether the input value for the CAM 100 includes bits for which matching is not attempted, that is, for which the CAM cell 110 is considered to match the input value regardless of the actual corresponding tag value bit.

In a CAM, it is expected that a majority of the CAM cells 110 will not match regardless of the actual corresponding tag value bit. Accordingly, it would be advantageous to reduce power consumption in a ternary CAM.

Alternative Embodiments

Although preferred embodiments are disclosed herein, many variations are possible which remain within the concept, scope, and spirit of the invention, and these variations would become clear to those skilled in the art after perusal of this application.

What is claimed is:

1. A content addressable memory, comprising: an input port capable of receiving an electrical charge independent from the electrical charge used to operate said memory, a plurality of CAM lines connected to said input port, a plurality of CAM cells connected to said CAM lines, wherein said memory transports said independent electrical charge from said input port through said CAM lines to said CAM cells.

2. The memory as in claim 1, wherein said memory includes a mask value for at least some lines of said memory.

3. The memory as in claim 1, wherein said memory includes a ternary content addressable memory.

4. The memory as in claim 1, wherein said independent electrical charge is between 20% to about 50% less in voltage than the electrical charge used to operate said memory.

5. The memory as in claim 1, wherein said independent electrical charge is between 20% to about 50% less voltage than about 2 volts.

6. The memory as in claim 1, wherein said independent electrical charge is about 1.8 volts.

7. The memory as in claim 1, wherein said independent electrical charge is about 1.0 volt.

8. The memory as in claim 1, wherein said independent electrical charge is less than about 2.0 volts.

9. The memory as in claim 1, wherein said independent electrical charge is substantially above a switching point for a sense amplifier.

10. A content addressable memory, comprising: an input port capable of receiving an electrical charge that is independent from the electrical charge used to operate said memory, a plurality of CAM lines connected to said input port, a set of sense amplifiers each coupled to at least one of said CAM lines, wherein said memory transports said independent electrical charge from said input port through said CAM lines to said sense amplifiers and each of said sense amplifiers is responsive to said independent electrical charge.

11. The memory as in claim 10, wherein said memory includes a mask value for at least some of said CAM lines of said memory.

12. The memory as in claim 10, wherein said memory includes a ternary content addressable memory.

13. The memory as in claim 10, wherein said independent electrical charge is between 20% to about 50% less voltage than about 2.0 volts.

14. The memory as in claim 10, wherein said independent electrical charge is between 20% to about 50% less in voltage than the electrical charge used to operate said memory.

15. The memory as in claim 10, wherein said independent electrical charge is about 1.8 volts.

16. The memory as in claim 10, wherein said independent electrical charge is about 1.0 volt.

17. The memory as in claim 10, wherein said independent electrical charge is less than about 2.0 volts.

18. The memory as in claim 10, wherein said independent electrical charge is substantially above a switching point for said sense amplifiers.

19. A content addressable memory, comprising: an input port capable of receiving an electrical charge that is independent from the electrical charge used to operate said memory, a plurality of CAM lines connected to said input port, a set of sense amplifiers each coupled to at least one of said CAM lines, wherein said memory is capable of transporting an independent electrical charge of substantially less in voltage than the operating voltage of said memory from said input port through said CAM lines to said sense amplifiers.

20. The memory as in claim 19, wherein said memory includes a mask value for at least some lines of memory.

21. The memory as in claim 19, wherein said memory includes a ternary content addressable memory.

22. The memory as in claim 19, wherein said independent electrical charge is between 20% to about 50% less in voltage than the electrical charge used to operate said memory.

23. The memory as in claim 19, wherein said independent electrical charge is between 20% to about 50% less voltage than about 2.0 volts.

24. The memory as in claim 19, wherein said independent electrical charge is about 1.8 volts.

25. The memory as in claim 19, wherein said independent electrical charge is about 1.0 volt.

26. The memory as in claim 19, wherein said independent electrical charge is less than about 2.0 volts.

27. The memory as in claim 19, wherein said independent electrical charge is substantially above a switching point for said sense amplifiers.

28. A method of operating a content addressable memory, said method comprising: receiving an independent electrical charge which is independent from that charge used to operate said memory and has a relatively lower power than that electrical charge used to operate said memory; and transporting said independent electrical charge through said content addressable memory.

29. The method of claim 28, further comprising: matching, for at least some lines of said memory, an input value for said memory against a mask value.

30. The method of claim 28, wherein said independent electrical charge is of less voltage than the electrical charge used to operate said memory.

31. The method of claim 28, wherein said independent electrical charge is between about 20% and 50% of the voltage of the electrical charge used to operate said memory.

32. The method of claim 28, wherein the electrical charge used to operate said memory is a voltage that is between about 20% and 50% greater than said independent electrical charge, wherein said independent electrical charge is greater than about 2 volts.

33. A method of operating a content addressable memory, said method comprising: receiving an electrical charge that is independent from the charge unto operate said memory; and matching at least one match line of said memory responsive to said independent electrical charge.

34. The method of claim 33, further comprising: matching, for at least some lines of said memory, an input value for said memory against a mask value.

35. The method of claim 33, wherein said independent electrical charge is of less voltage than the electrical charge used to operate said memory.

36. The method of claim 33, wherein the electrical charge used to operate said memory is a voltage that is between about 20% and 50% greater than said independent electrical charge, wherein said independent electrical charge is greater than about 2.0 volts.

37. The method of claim 33, wherein said independent electrical charge is between about 20% and 50% of the voltage of the electrical charge used to operate said memory.

38. A method of operating a content addressable memory, comprising: receiving an electrical charge that is independent from the charge used to operate said memory; matching at least one match line of said memory responsive to said independent electrical charge; and consuming relatively lower power during operation of said memory responsive to said independent electrical charge, wherein said independent electrical charge voltage is substantially less than the voltage of said charge used to operate said memory.

39. The method of claim 38, further comprising: matching, for at least some lines of said memory, an input value for said memory against a mask value.

40. The method of claim 38, wherein the electrical charge used to operate said memory is a voltage that is between about 20% and 50% greater than said independent electrical charge, wherein said independent electrical charge is greater than about 2.0 volts.

41. The method of claim 38, wherein said independent electrical charge is between about 20% and 50% of the voltage of the electrical charge used to operate said memory.

42. An apparatus including a content addressable memory, said apparatus comprising: means for receiving an independent electrical charge which is independent from the charge used to operate said memory and has a relatively lower power than the electrical charge used to operate said memory; and means for transporting said independent electrical charge through said content addressable memory.

43. The apparatus of claim 42, further comprising: means for matching, for at least some lines of said memory, an input value for said memory against a mask value.

44. The apparatus of claim 42, wherein said independent electrical charge is of less voltage than the electrical charge used to operate said memory.

45. The apparatus of claim 42, wherein said independent electrical charge is between about 20% and 50% of the voltage of the electrical charge used to operate said memory.

46. The apparatus of claim 42, further comprising: means for electrically charging said memory to a voltage that is between about 20% and 50% greater than said independent electrical charge, wherein said independent electrical charge is greater than about 2.0 volts.

47. The apparatus of claim 42, wherein said independent electrical charge is about 1.8 volts.

48. The apparatus of claim 42, wherein said independent electrical charge is about 1.0 volt.

49. The apparatus of claim 42, wherein said independent electrical charge is less than 2.0 volts.

50. The apparatus of claim 42, wherein said apparatus comprises means for receiving and transporting an independent electrical charge that is substantially above a switching point for a sense amplifier.

51. An apparatus for operating a content addressable memory, said apparatus comprising: means for receiving an electrical charge that is independent from the charge used to operate said memory; and means for matching at least one match line of said memory responsive to said independent electrical charge.

52. The apparatus of claim 51, further comprising: means for matching, for at least some lines of said memory, an input value for said memory against a mask value.

53. The apparatus of claim 51, wherein said independent electrical charge is of less voltage than the electrical charge used to operate said memory.

54. The apparatus of claim 51, wherein said independent electrical charge is between about 20% and 50% of the voltage of the electrical charge used to operate said memory.

55. The apparatus of claim 51, further a voltage that is between about 20% and 50% greater than said independent electrical charge, wherein said independent electrical charge is greater than about 2.0 volts.

56. The apparatus of claim 55, wherein said means for electrically charging said memory produces a voltage that is between 20% to about 50% less voltage than about 2.0 volts.

57. The apparatus of claim 51, wherein said means for receiving an independent electrical charge is capable of receiving and transporting an independent electrical charge that is about 1.0 volt.

58. The apparatus of claim 51, wherein said means for receiving an independent electrical charge is capable of receiving and transporting an independent electrical charge that is less than 2.0 volts.

59. The apparatus of claim 51, wherein said means for receiving an independent electrical charge is capable of receiving and transporting an independent electrical charge that is substantially above the switching point for a sense amplifier.

60. An apparatus for operating a content addressable memory, said apparatus comprising: means for receiving an electrical charge that is independent from the charge used to operate said memory; means for matching at least one match line of said memory responsive to said independent electrical charge; and means for consuming relatively lower power during operation of said memory responsive to said independent electrical charge, when said independent electrical charge voltage is substantially less than the voltage of said charge used to operate said memory.

61. The apparatus of claim 60, further comprising: means for matching, for at least some lines of said memory, an input value for said memory against a mask value.

62. The apparatus of claim 60, wherein said independent electrical charge is of less voltage than the electrical charge used to operate said memory.

63. The apparatus of claim 60, wherein said independent electrical charge is between about 20% and 50% of the voltage of the electrical charge used to operate said memory.

64. The apparatus of claim 60, further comprising means for electrically charging said memory to produce a voltage that is between about 20% and 50% greater than said independent electrical charge, wherein said independent electrical charge is greater than about 2.0 volts.

65. The apparatus of claim 60, wherein said means for electrically charging said memory produces a voltage that is between 20% to about 50% less voltage than 2.0 volts.

66. The apparatus of claim 60, wherein said means for receiving an independent electrical charge is capable of receiving and transporting an independent electrical charge that is about 1.0 volt.

67. The apparatus of claim 60, wherein said means for receiving an independent electrical charge is capable of receiving and transporting an independent electrical charge that is less than about 2.0 volts.

68. The apparatus of claim 60, wherein said means for receiving an independent electrical charge is capable of receiving and transporting an independent electrical charge that is substantially above the switching point for a sense amplifier.

* * * * *